United States Patent
Hsu et al.

(10) Patent No.: US 7,098,049 B2
(45) Date of Patent: Aug. 29, 2006

(54) SHALLOW TRENCH ISOLATION VOID DETECTING METHOD AND STRUCTURE FOR THE SAME

(75) Inventors: Ping Hsu, Jhonghe (TW); Yi-Nan Chen, Taipei (TW)

(73) Assignee: NANYA Technology Corp., Taoyuan (TW)

( * ) Notice: Subject to any disclaimer, the term of this patent is extended or adjusted under 35 U.S.C. 154(b) by 120 days.

(21) Appl. No.: 10/714,952

(22) Filed: Nov. 18, 2003

(65) Prior Publication Data

US 2005/0104063 A1    May 19, 2005

(51) Int. Cl.
*H01L 21/66* (2006.01)
*G01R 31/26* (2006.01)

(52) U.S. Cl. .......................................... 438/14; 438/18

(58) Field of Classification Search ............... 438/17, 438/18, 14–16; 257/48; 716/4
See application file for complete search history.

(56) References Cited

U.S. PATENT DOCUMENTS

| | | | |
|---|---|---|---|
| 5,889,410 A * | 3/1999 | El-Kareh et al. | 324/769 |
| 6,714,031 B1 * | 3/2004 | Seki | 324/763 |
| 2003/0034489 A1 * | 2/2003 | Bhattacharya et al. | 257/48 |
| 2005/0095727 A1 * | 5/2005 | Chang et al. | 438/14 |

* cited by examiner

*Primary Examiner*—Thanhha Pham
(74) *Attorney, Agent, or Firm*—Bacon & Thomas, PLLC

(57) ABSTRACT

Disclosed is a method for detecting STI void of a semiconductor wafer. The method of the present invention comprises steps of assigning a detecting area in a predetermined region of the wafer; forming active areas and gate strips crossing the active areas by the process synchronized with that for other regions of the wafer. Dielectric material is filled between the active areas. The adjacent portion between the active areas reaches a predetermined length at least. The electrical value of the gate strips is measured to determine whether there is any void in the dielectric filled between the active areas, thereby to derive whether there is any void generated in the STI between the active areas of the other regions of the wafer.

5 Claims, 3 Drawing Sheets

SHALLOW TRENCH ISOLATION VOID DETECTING METHOD AND STRUCTURE FOR THE SAME

BACKGROUND OF THE INVENTION

1. Field of the Invention

The present invention relates to a semiconductor device process, more specifically, to a method for detecting if there is any void in STI.

2. Description of the Prior Art

In the process for semiconductor devices getting more and more compact, shallow trench isolation (STI) is used to separate active areas 10 for forming respective elements. STI is formed between active areas 10 and is filled with dielectric 12, which can be oxide such as silicon oxide. However, a void 13 is likely to be generated in the step of filling with the dielectric 12, as shown in FIG. 1.

In DRAM process, such a condition also happens. With reference to FIG. 2, which is a schematic top view of a gate region structure of a DRAM, reference number 20 indicates an active area, 21 indicates a gate line, 24 indicates a deep trench. As shown in the drawing, the adjacent portion between the active areas is short. Reference number 23 indicates a void formed in the dielectric filled in the STI between the active areas 20. The existence of the void 23 may influence the electric performance of the semiconductor structure. However, such a void is very small and is hardly found during the process. Usually, the existence of the void only can be found in the electric testing, for example, testing of voltage (potential, current, resistance, inductance, or capacitance between two gate lines 21, which is performed after the wafer is finished, cut into chips and packed. Accordingly, a waste of process is generated.

Therefore, there is a need for a solution to overcome the problems stated above. The present invention satisfies such a need.

SUMMARY OF THE INVENTION

An objective of the present invention is to provide a STI void detecting method for semiconductor wafers. The method of the present invention can find in time whether there is any void formed in STI, so that the defective products can be found in the early stage, thereby reducing the waste of the cost and working hours.

Another objective of the present invention is to provide a STI void detecting region structure for semiconductor wafers. By forming and testing the testing region structure of the present invention, whether there is any void formed in STI can be found in time.

According to an aspect of the present invention, a shallow trench isolation void detecting method for a semiconductor wafer comprises steps of assigning a testing region in a predetermined region of the semiconductor wafer; forming active areas and gate lines associated with the active areas in said detecting region by a synchronous process for other regions, filling a trench between the active areas with dielectric, the adjacent portion between the active areas having at least a predetermined length; and detecting the electric values of the gate lines to determine whether there is a void formed in the dielectric filled in the trench between the active areas.

According to another aspect of the present invention, a testing region structure for semiconductor wafer STI void detecting is formed on the wafer by a process synchronizing for other portions of the wafer. The testing region structure comprises a plurality of active areas, trenches between the active areas being filled with dielectric, and the portions of the active areas adjacent to each other having at least a predetermined length; and a plurality of gate lines inter with the active areas.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETAILED DESCRIPTION OF THE PREFERRED EMBODIMENT

An embodiment of the present invention will be described in detail with reference to the accompanying drawings.

According to an embodiment of the present invention, at predetermined locations on the wafer, preferably the cut lines portion, testing regions comprising active areas and gate lines are produced by the synchronous process for other portions of the wafer.

Figure 1:
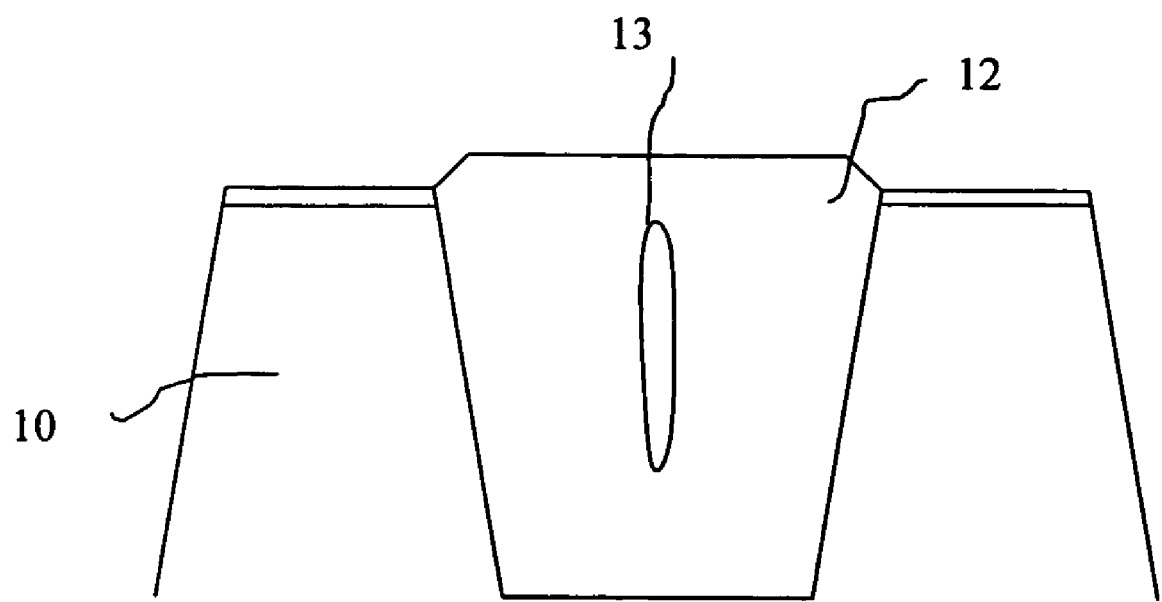
FIG. 1 shows a schematic sectional diagram illustrating a void formed in a STI of a semiconductor device.
Figure 2:
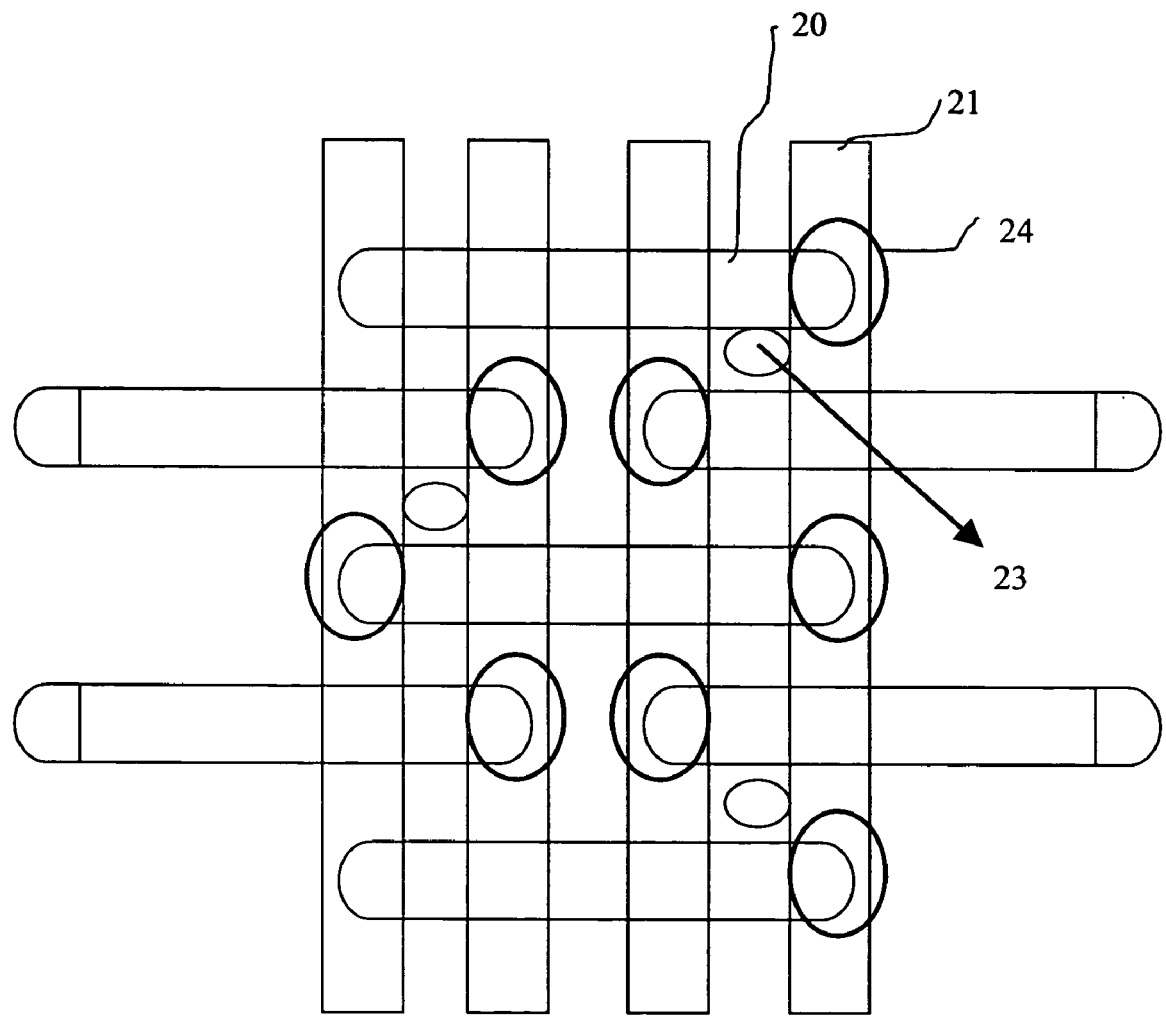
FIG. 2 is a schematic top view showing the arrangement of the active areas and gate lines of a semiconductor device in prior art.
Figure 3:
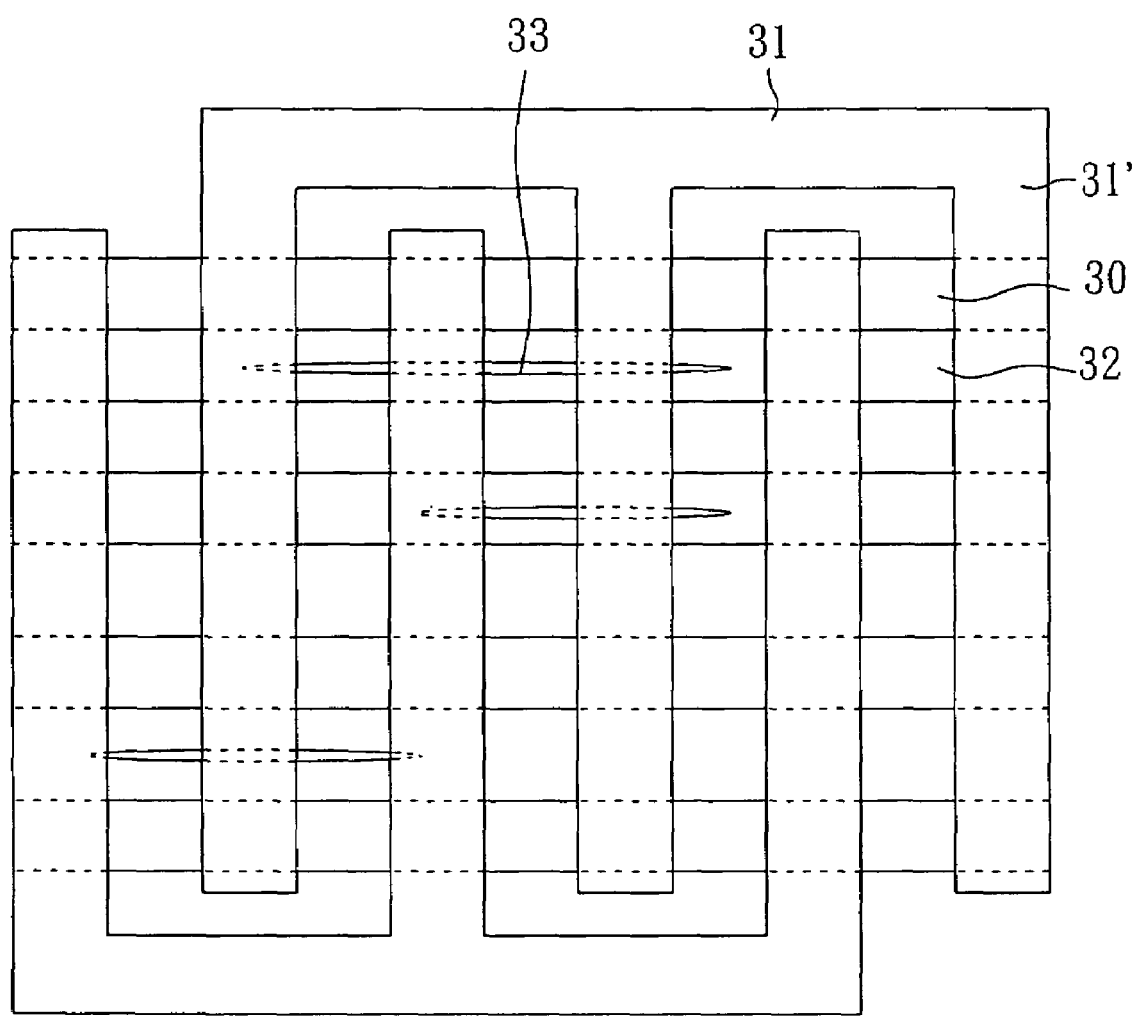
FIG. 3 is a schematic top view showing the arrangement of the active areas and gate lines of a semiconductor device in accordance with an embodiment of the present invention.

As shown in FIG. 3, the sections of active areas 30 in the testing region are formed as long strips. Accordingly, the active areas 30 are adjacent to each other. Shallow trenches formed between the active areas 30 are filled with dielectric 32 by the process synchronous with other portions of the wafer. As shown, in the present embodiment, the active areas 30 are preferably formed as parallel strips. Since the length of the portions of two active areas 30 adjacent to each other is very long, if the re is void 33 formed in the dielectric 32, the void 33 will be a long void. Gate lines 31' in the testing region are arranged at an interval the same as the gate lines in other non-testing regions. As shown, since the section of the void 33 is long, the void 33 crosses at least two gate lines 31'. Accordingly, for example, it is easy to detect whether there is avoid existing by performing a electric test such as measuring potentials of the gate lines 31' in the testing region, for example, by measuring the potential between two gate lines 31' with a proper voltage applied thereto to obtain a value other than 0 if the void 33 exists, and a value 0 if the void 33 does not exist.

According to the present embodiment, for the sake of convenience of measuring, the gate 31 can be formed as a comb-shaped gate. That is, the odd gate lines are connected together, while the even gate lines are connected together, thereby forming a dual-comb structure. Then the potential of a plurality of gate lines can be measured at the same time, for example by using the above described electric test.

The testing region is produced synchronously with other regions of the wafer. Accordingly, if a void is detected in the testing region, it can be determined that there are voids formed in other portions of the wafer. Then the detective products can be found and eliminated at an early stage, but not the stage after the wafer is cut into chips and packed. Thus, unnecessary working process is avoided, and therefore the working hours and cost are reduced.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for detecting an STI void of a semiconductor wafer, comprising steps of:
    assigning a test region in a region of the semiconductor wafer;
    forming, the test region, by a process synchronous with other portions of the semiconductor wafer, active areas, trenches between the active areas, and gate lines intersecting with the active areas, said trenches being filled with dielectric, and said active areas having their adjacent portion reaching a length crossing at least two gate lines; and
    measuring electric values between said gate lines to determine whether there is a void formed in the trenches.

2. The method as claimed in claim 1, wherein said active areas in the testing region are formed as parallel strips.

3. The method as claimed in claim 1, wherein the testing region is formed on a cutting line of the semiconductor wafer.

4. A method for detecting an STI void of a semiconductor wafer, comprising steps of:
    assigning a test region in a region of the semiconductor wafer;
    forming, in the test region, by a process synchronous with other portions of the semiconductor wafer, active areas, trenches between the active areas, and gate lines intersecting with the active areas, said trenches being filled with dielectric; and
    measuring electric values between said gate lines to determine whether there is a void formed in the trenches,
    wherein odd ones of said gate lines are connected together, while even ones of the said gate lines are connected together, so as to form a dual-comb structure.

5. The method as claimed in claim 4, wherein said measuring step is to measure the potentials between the comb structure of the odd gate lines and the comb structure of the even gate lines.

* * * * *